(12) United States Patent
Merritt et al.

(10) Patent No.: US 6,535,999 B1
(45) Date of Patent: Mar. 18, 2003

(54) TEST AND OBSERVE MODE FOR EMBEDDED MEMORY

(75) Inventors: Todd A. Merritt, Boise, ID (US); Nick Van Heel, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/352,352

(22) Filed: Jul. 13, 1999

(Under 37 CFR 1.47)

(51) Int. Cl.7 .............................................. G01R 31/28
(52) U.S. Cl. ........................................ 714/30; 714/718
(58) Field of Search ................... 714/718, 30, 719

(56) References Cited

U.S. PATENT DOCUMENTS

| | | | |
|---|---|---|---|
| 4,481,627 A | 11/1984 | Beauchesne et al. | |
| 4,701,918 A | * 10/1987 | Nakajima et al. ........... | 714/724 |
| 4,969,148 A | 11/1990 | Nadeau-Dostie et al. | |
| 5,042,011 A | 8/1991 | Casper et al. | |
| 5,280,205 A | 1/1994 | Green et al. | |
| 5,471,482 A | 11/1995 | Byers et al. | |
| 5,535,165 A | * 7/1996 | Davis et al. ........... | 365/189.05 |
| 5,617,531 A | 4/1997 | Crouch et al. | |
| 5,627,785 A | 5/1997 | Gilliam et al. | |
| 5,663,965 A | 9/1997 | Seymour | |
| 5,731,984 A | * 3/1998 | Ullmann ..................... | 702/108 |
| 5,764,878 A | 6/1998 | Kablanian et al. | |
| 5,784,323 A | 7/1998 | Adams et al. | |
| 5,828,825 A | 10/1998 | Eskandari et al. | |
| 6,158,036 A | * 12/2000 | Kwak ................... | 365/189.02 |

* cited by examiner

*Primary Examiner*—Robert Beausoliel
*Assistant Examiner*—Yolanda L. Wilson
(74) *Attorney, Agent, or Firm*—Dickstein Shapiro Morin & Oshinsky LLP

(57) ABSTRACT

A method and apparatus that tests and observes how an embedded DRAM is being accessed by a logic circuit controlling the DRAM is provided. The test and observe method and apparatus pipes the outputs of the logic, which is used as inputs to the embedded DRAM, to an observation device. The outputs of the logic device are then observed at the observation device to determine how the DRAM is being accessed. In addition, information concerning what data is being trapped and when may be output to the observation device to determine setup and hold times for the DRAM.

48 Claims, 2 Drawing Sheets

TEST AND OBSERVE MODE FOR EMBEDDED MEMORY

BACKGROUND OF THE INVENTION

1. Field of the Invention

The present invention relates to the field of testing semiconductor memory devices and, more particularly to a test and observe mode for an embedded dynamic random access memory (DRAM) device.

2. Description of the Related Art

Dynamic random access memories (DRAMs) contain an array of individual memory cells. Typically, each DRAM memory cell comprises a capacitor for holding a charge and an access transistor for accessing the capacitor charge. The charge is representative of a data bit and can be either high voltage or low voltage (representing, e.g., a logical "1" or a logical "0," respectively). Data can be stored in memory during write operations or read from memory during read operations.

Refresh, read, and write operations in present-day DRAMs are typically performed for all cells in one row simultaneously. Data is read from memory by activating a row, referred to as a word line, which couples all memory cells corresponding to that row to digit or bit lines which define the columns of the array. When a particular word line and bit line are activated, a sense amplifier detects and amplifies the data in the addressed cell by measuring the potential difference on the activated bit line corresponding to the content of the memory cell connected to the activated word line. The operation of DRAM sense amplifiers is described, for example, in U.S. Pat. Nos. 5,627,785; 5,280,205; and 5,042,011, all assigned to Micron Technology Inc. and incorporated by reference herein.

An embedded DRAM resides on a complex semiconductor circuit containing significant amounts of both DRAM and logic units (for example, a processor). This results in a compact design with minimal propagation distances between the logic units and the memory cells. Embedded DRAM also offers the advantages of simpler system-level design, fewer packages with fewer pins, reduced part count, and lower power consumption. This reduction in external circuit connections increases the efficiency of the DRAM and the overall logic processing device or application. For example, the bandwidth, the number of input and output pins, of the DRAM can increase because less circuitry is required to operate the DRAM. Speed also increases since the logic and control signals, as well as the input and output data, travel shorter distances.

Since the function of the embedded DRAM is very critical to the overall integrated circuit (IC) it resides on, it is extremely important to verify that the embedded DRAM survives the manufacturing process and still operates as it was intended to. Typically, the embedded DRAM is tested by writing a known pattern or series of patterns into the DRAM, reading the pattern out of the DRAM and then comparing the read pattern to the known pattern. Any discrepancies would indicate that memory cells within the DRAM were corrupted and need to be repaired.

Currently, embedded DRAM is tested by one of two methods. The first method utilizes an external testing device which is programmed to exercise the memory cells of the embedded DRAM as described above. The testing device supplies the necessary address, data and control signals to the embedded DRAM through the integrated circuit's pads or package pins. The contents of the memory cells within the DRAM are read by the testing device, compared to the test data and evaluated to determine if there were any errors.

The second method is performed internally on the integrated circuit and is often referred to as a built-in-self-test (BIST). A typical BIST circuit utilizes pattern generators to generate test data and the addresses of the to-be-tested memory cells. The BIST circuit includes logic to write the test patterns into the addressed cells of the DRAM, read the patterns out of the cells and evaluate the patterns to determine if any of the DRAM memory cells are defective.

Although these methods work well to determine if the embedded DRAM is capable of storing and outputting data, these methods do not indicate how the DRAM is being accessed. That is, the methods do not determine how the IC's logic is accessing and controlling (also known in the art as "driving") the embedded DRAM. In the first method, the external tester is driving the DRAM, not the IC's logic and therefore, a determination of how the DRAM is being driven by the logic can not be made. In the second method, a BIST circuit is driving the embedded DRAM and the information on how the DRAM is being accessed is incapable of being properly tested, determined or reported.

Determining how the embedded DRAM is being accessed by the circuit's logic is very important and is particularly useful to test and debug the logic during a design stage. Accordingly, there is a need and desire for an embedded DRAM testing scheme that determines how the DRAM is being accessed.

SUMMARY OF THE INVENTION

The present invention provides an embedded DRAM testing scheme that determines how the DRAM is being accessed.

The above and other features and advantages of the invention are achieved by a method and apparatus that tests and observes how an embedded DRAM is being accessed by a logic circuit controlling the DRAM. The test and observe method and apparatus pipes the outputs of the logic, which is used as inputs to the embedded DRAM, to an observation device. The outputs of the logic device are then observed at the observation device to determine how the DRAM is being accessed. In addition, information concerning what data is being trapped and when may be output to the observation device to determine setup and hold times for the DRAM.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 1:
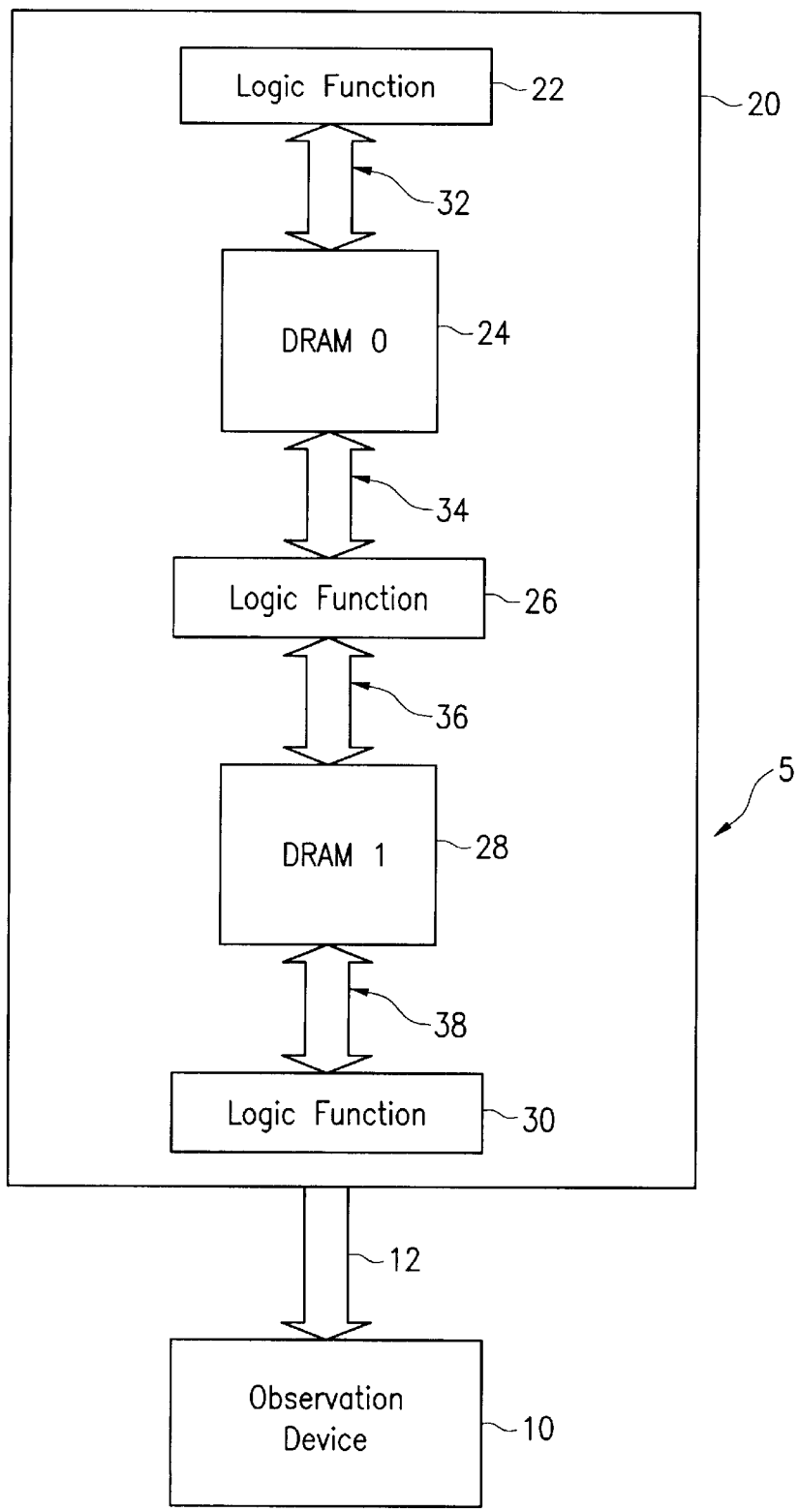
FIG. 1 is a high level block diagram illustrating an exemplary apparatus for testing and observing embedded DRAM constructed in accordance with the present invention.

FIG. 1 is a high level block diagram illustrating an exemplary apparatus 5 for testing and observing an embedded DRAM constructed in accordance with the present invention. The apparatus 5 includes an integrated circuit (IC) 20 containing two DRAM circuits 24, 28 and three logic function circuits 22, 26, 30. The IC 20 may include only one DRAM circuit or it may contain additional DRAM circuits as desired and is not to be limited to the two DRAM circuits 24, 28 illustrated in FIG. 1. Likewise, the IC 20 may contain any number of logic function circuits and is not to be limited to the illustrated three logic function circuits 22, 26, 30.

The first logic function circuit 22 is coupled to the first DRAM circuit 24 via a first plurality of signals 32. The second logic function circuit 26 is coupled to the first DRAM circuit 24 via a second plurality of signals 34. The second logic function circuit 26 is also coupled to the second DRAM circuit 28 via a third plurality of signals 36. The third logic function circuit 30 is coupled to the second DRAM circuit 28 via a fourth plurality of signals 38. The signals 32, 34, may include address, control and data signals or any other signals required by the first and second logic function circuits 22, 26 to drive the first DRAM circuit 24. Likewise, the signals 36, 38, may include address, control and data signals or any other signals required by the second and third logic function circuits 26,30 to drive the second DRAM circuit 28. Examples of these signals 32, 34, 36, 38 include chip select (CS), column address strobe (CAS), row address strobe (RAS), data read (DR), data write (DW), write enable (WE), data masking (DQM) and clock enable (CKE) signals.

The DRAM circuits 24, 28 each contain memory cells organized as arrays of rows and columns as well as additional circuitry required to read information out of the memory cells and to write information into the memory cells. The first and second logic function circuits 22, 26 contain sufficient logic to drive the first DRAM circuit 24. The second and third logic function circuits 26, 30 contain sufficient logic to drive the second DRAM circuit 28.

The IC 20 may be configured into a normal operational mode, test mode and test and observe mode. The normal and test modes are conventional modes. That is, under the normal mode, the DRAM circuits 24, 28 are driven by their respective logic function circuits 22, 26, 30. While in the test mode, the DRAM circuits 24, 28 are driven by an external testing device to perform a memory test. As will be discussed below, the test and observe mode of the present invention is unique and provides information on how the DRAM circuits 24, 28 are being accessed by their respective logic function circuits 22, 26, 30 a feature which is not currently being performed by conventional embedded memory circuit devices.

The apparatus 5 also includes an observation device 10 coupled to the IC 20 via a plurality of test signals 12. As will be described below with reference to FIG. 2, the observation device 10 will be used to observe how the two DRAM circuits 24, 28 are being accessed when the IC 20 is placed into the test and observe mode. The test signals 12 may include any signal outputs from the logic function circuits 22, 26, 30 used to drive the two DRAM circuits 24, 28 and may also include test data input/output by the DRAM circuits 24, 28 during the test and observe mode. Examples of the test signals 12 include chip select (CS), column address strobe (CAS), row address strobe (RAS), data read (DR), data write (DW), write enable (WE), data masking (DQM), clock enable (CKE) and test data (TDQ) signals.

The observation device 10 is used to analyze the test signals 12 to ensure that the DRAM circuits 24, 28 are being properly accessed by the logic function circuits 22, 26, 30. The observation device 10 may be any conventional memory testing device, oscilloscope, logic analyzer or any device capable of displaying or recording the status of the test signals 12. The exact device used as the observation device 10 may vary based upon the preference of the test operator and the invention is not to be limited to any particular observation device 10.

Figure 2:
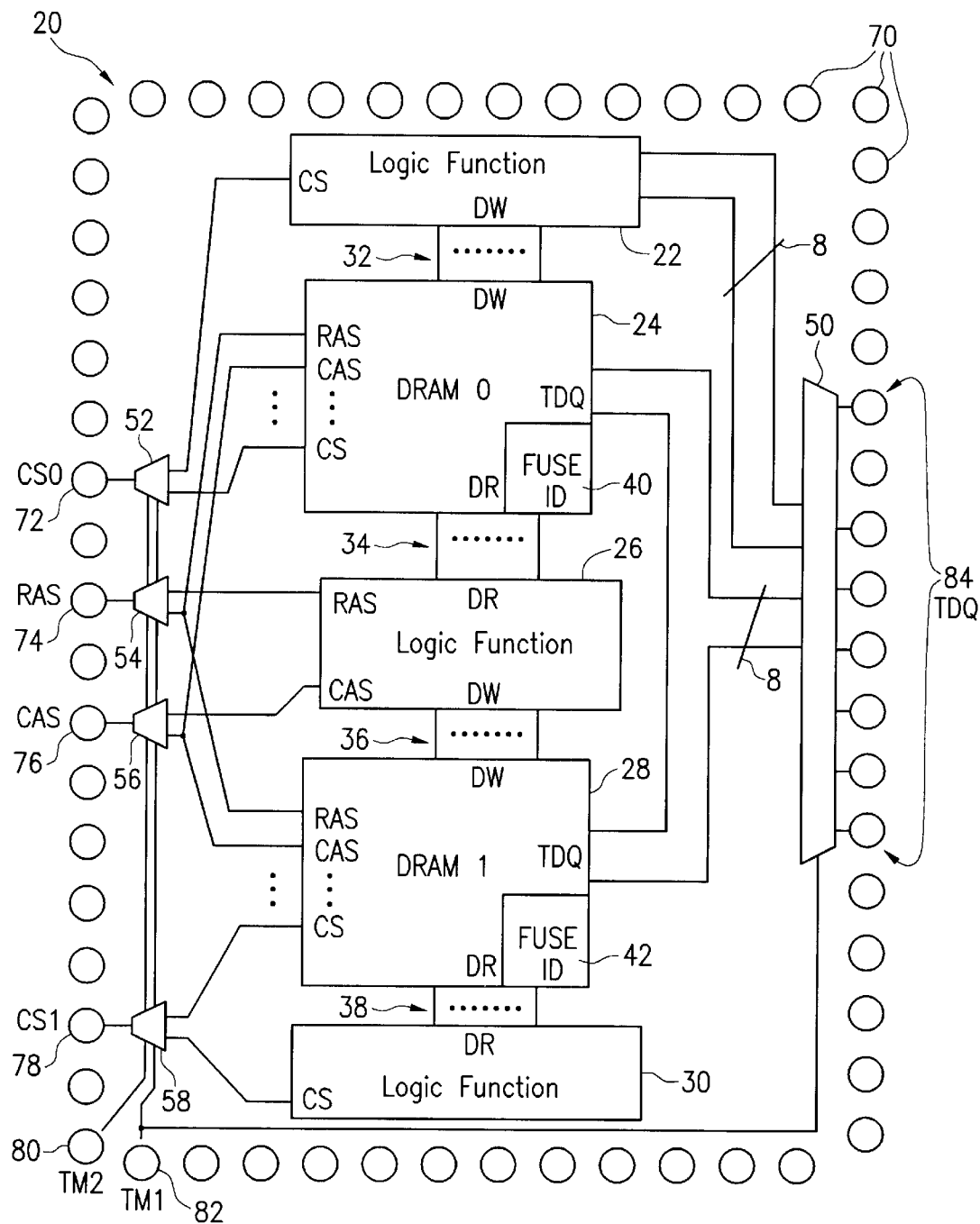
FIG. 2 is a block diagram illustrating an integrated circuit having embedded DRAM utilized in the apparatus of FIG. 1.

FIG. 2 is a detailed block diagram of the IC 20 used in the apparatus 5 illustrated in FIG. 1. The IC 20 has a plurality of pads 70 used for inputting signals and information into the IC 20 and for outputting information and signals out of the IC 20. For convenience purposes only, different reference numerals are used for pads 70 that are of particular interest during the test and observe mode. The names given to these pads correspond to the signals that travel through the pads. It is desirable for these signals to include chip select (CS), column address strobe (CAS), row address strobe (RAS), test mode and test data (TDQ) signals. Thus, the additional pads contain chip select 0 (CS0) pad 72, row address strobe (RAS) pad 74, column address strobe (CAS) 76, chip select 1 (CS1) pad 78, test mode 2 (TM2) pad 80, test mode 1 (TM1) pad 82 and test data (TDQ) pads 84. These additional pads 72, 74, 76, 78, 80, 82, 84 will be connected to the observation device (FIG. 1) when the IC 20 is placed into the test and observe mode.

The first DRAM circuit 24 contains a configuration identifier often referred to as a fuse ID circuit 40. The fuse ID circuit 40 contains information about the configuration of the DRAM circuit 24 as well as circuitry to output the configuration information. The second DRAM circuit 28 contains a second fuse ID circuit 42. The second fuse ID circuit 42 contains information about the configuration of the second DRAM circuit 28 as well as circuitry to output the configuration information. Typically, the configuration information is output from the fuse ID circuits 40, 42 during the conventional test mode, but as will become apparent, the present invention provides a new and additional test configuration identified as the test and observe mode. The test and observe mode does not output the configuration information since it is typically output during the test mode. As will be described below, a second embodiment of the test and observe mode of the present invention will utilize the fuse ID circuits 40, 42 to output test signals to the observation device.

The first DRAM circuit 24 receives at least the chip select (CS) and data write (DW) signals from the first logic function circuit 22 while receiving at least the row address strobe (RAS), column address strobe (CAS) and data read (DR) signals from the second logic function circuit 26. The first DRAM circuit 24 receives other signals such as a write enable (WE), data masking (DQM), clock enable (CE) as well as addressing signals used to access the circuit's 24 memory cells from the first and second logic function circuits 22, 26. It is desirable to output and observe at least the CS, CAS and RAS signals to determine how the DRAM circuit 24 is being accessed.

The second DRAM circuit 28 receives at least the chip select (CS) and data read (DR) signals from the third logic function circuit 30 while receiving at least the row address strobe (RAS), column address strobe (CAS) and data write (DW) signals from the second logic function circuit 26. The second DRAM circuit 28 receives other signals such as a write enable (VVE), data masking (DQM), clock enable (CE) as well as addressing signals used to access the circuit's 28 memory cells from the second and third logic function circuits 26, 30. It is desirable to output and observe at least the CS, CAS and RAS signals to determine how the DRAM circuit 28 is being accessed.

The IC 20 also includes five multiplexers 50, 52, 54, 56, 58. These multiplexers 50, 52, 54, 56, 58 are used to input the desired to-be-observed signals, such as the CAS, RAS, CSx and TDQ signals, and output the signals over their corresponding pads 72, 74, 76, 78, 84. As will be described below, the multiplexers 50, 52, 54, 56, 58 are controlled by the TM1 And TM2 signals input through the TM1 and TM2 pads 82, 80.

The first multiplexer 50 has a first multi-signal input connected to an output of the first logic function circuit 22 and a second multi-signal input connected to the TDQ outputs of the first and second DRAM circuits 24, 28. The output from the first logic function circuit 22 may include any logic function data desired to be output when the IC 20 is placed in the normal mode, while the TDQ information includes test data from the DRAM circuits 24, 28. The first multiplexer 50 has a multi-signal output connected to the TDQ pads 84 and is controlled by a TM1 signal provided through the TM1 pad 82. When the IC 20 is in normal mode, the outputs of the first logic function circuit 22 are connected to the TDQ pads 84. When the IC 20 is in the test mode or the test and observe mode, the outputs of either the first DRAM circuit 24 or the second DRAM circuit 28 are connected to the TDQ pads 84 (depending upon which DRAM circuit is currently activated).

The second multiplexer 52 has an input connected to the first logic function circuit 22 and an output connected to the first DRAM circuit 24. A chip select signal CS is an input to the first DRAM circuit 24 from either the first logic function circuit 22 or the CS0 pad 72. In a normal mode of operation, the CS will be input from the first logic function circuit 22. In a test mode, the CS will be input from the CS0 pad 72. In the test and observe mode, the CS from the first logic function circuit 22 is supplied to both the CS0 pad 72 and the first DRAM circuit 24. The second multiplexer 52 is controlled by the TM1 signal provided through the TM1 pad 82 and a TM2 signal provided through the TM2 pad 80. The normal, test and test and observe modes are dependent upon the combination of the TM1 and TM2 signals which are user defined and application specific. Accordingly, any combination of the TM1 and TM2 signals may be used.

The third multiplexer 54 has an input connected to the second logic function circuit 26 and an output connected to the first and second DRAM circuits 24, 28. A RAS signal is an input to the first or second DRAM circuit 24, 28 (depending upon which DRAM circuit is currently activated) from either the second logic function circuit 26 or the RAS pad 74. In a normal mode of operation, the RAS will be input from the second logic function circuit 26. In a test mode, the RAS will be input from the RAS pad 74. In the test and observe mode, the RAS from the second logic function circuit 26 is supplied to the RAS pad 74 and to either the first or second DRAM circuit 24, 28 (depending upon which DRAM circuit is currently activated). The third multiplexer 54 is controlled by the TM1 and TM2 signals.

The fourth multiplexer 56 has an input connected to the second logic function circuit 26 and an output connected to the first and second DRAM circuits 24, 28. A CAS signal is an input to the first or second DRAM circuit 24, 28 (depending upon which DRAM circuit is currently activated) from either the second logic function circuit 26 or the CAS pad 76. In a normal mode of operation, the CAS will be input from the second logic function circuit 26. In a test mode, the CAS will be input from the CAS pad 76. In the test and observe mode, the CAS from the second logic function circuit 26 is supplied to the CAS pad 76 and to either the first or second DRAM circuit 24, 28 (depending upon which DRAM circuit is currently activated). The fourth multiplexer 56 is controlled by the TM1 and TM2 signals.

The fifth multiplexer 58 has a first input connected to the third logic function circuit 30 and an output connected to the second DRAM circuit 28. A CS signal is an input to the second DRAM circuit 28 from either the third logic function circuit 30 or the CS1 pad 78. In a normal mode of operation, the CS will be input from the third logic function circuit 30. In a test mode, the CS will be input from the CS1 pad 78. In the test and observe mode, the CS from the third logic function circuit 30 is supplied to both the CS1 pad 78 and the second DRAM circuit 28. The fifth multiplexer 58 is controlled by the TM1 and TM2 signals.

It must be noted that the normal, test and test and observe modes are dependent upon the combination of the TM1 and TM2 signals which are user defined and application specific. Accordingly, any combination of the TM1 and TM2 signals may be used to implement the present invention.

In operation, by configuring the IC 20 via the TM1 and TM2 signals, the signals provided by the logic function circuits 22, 26, 30 that are used to access the memory cells of the DRAM circuits 24, 28, or the signals that are used by the DRAM circuits 24, 28 and any test data used by the DRAM circuits 24, 28, can be piped to the observation device through the pads 72, 74, 76, 78, 84 (via the five multiplexers 52, 54, 56, 58, 50). Preferably, the signals are piped from the logic function circuits 22, 26, 30 and also applied to the DRAM circuits 24, 28 to fully simulate, test and observe the interaction of these circuits. However, it must be noted that the test and observe mode of the present invention can merely pipe out the signals from the logic function circuits 22, 26, 30 to analyze the logic of these circuits without exercising the memory within the DRAM circuits 24, 28 if so desired.

Since there are two test mode signals TM1 and TM2, there are four possible configuration states for the IC 20. Therefore, it is possible to configure the IC 20 into a test mode identified by TM1 set to 1 and a TM2 set to 0 that would output, for example, all of the CS, RAS, CAS signals from the logic functions 22, 26, 30 through the CS0, CS1, RAS and CAS pads 72, 78, 74, 76 (via the second, third, fourth and fifth multiplexers 52, 54, 56, 58) and the TDQ data from the activated DRAM circuit 24, 28 through the TDQ pads 84 (via the first multiplexer 50). As will be discussed below, it is also possible to configure the IC 20 into another test mode where the CS, RAS, CAS signals from the activated DRAM circuit 24, 28 are output through the TDQ pads 84. Since additional signals, such as WE, DQM and CKE may also be output, the IC 20 can be configured via TM1 and TM2 to output these signals, either through additional pads 70 or the TDQ pads 84, as well.

Once the aforementioned signals and data are received at the observation device, the information can be analyzed to determine if the DRAM circuits 24, 28 are being properly accessed. This is extremely useful for debugging the logic functions 22, 26, 30 and the memory of the DRAM circuits 24, 28 prior to a mass production of the IC 20. That is, the test and observe mode of the present invention would be preferably implemented into prototype integrated circuits to ensure that the logic driving the embedded memory, as well as the memory itself, is not inherently defective. The TDQ information can be used to determine what information is being latched and when, which is particularly useful to analyze hold and set-up times. Once the IC 20 is fully debugged using the test and observe mode, the five multiplexers 50, 52, 54, 56, 58 can be removed from the IC 20 prior to the mass production of a commercial IC 20.

In a second embodiment of the test and observe mode of the present invention, the fuse ID circuits 40, 42 are used to pipe the CS0, CS1, CAS, and RAS information out of the TDQ pads 84 (via the first multiplexer 50) as opposed to the individual CS0, CS1, CAS and RAS pads 72, 78, 74, 76 (via the second, third, fourth and fifth multiplexers 52, 54, 56, 58) of the IC 20. This is accomplished by internally latching the aforementioned signals within the first or second DRAM circuits 24, 28 and then using the existing test mode circuitry of the fuse ID circuits 40, 42 to route the signals over the TDQ outputs of the circuits 24, 28 to the first multiplexer 50 and out through the TDQ pads 84. This can be accomplished by using a different combination of the TM1 and TM2 signals to create a second test and observe mode. In the second test and observe mode, each DRAM circuit 24, 28 will use their respective fuse ID circuits 40, 42 to output the CSx, RAS and CAS signals out of their respective TDQ outputs to the first multiplexer 50 and out of the TDQ pads 84. Therefore, CSx, RAS and CAS signals, not test data, will be output through the TDQ pads 84 to the observation device and no information is output to the second, third, fourth and fifth multiplexers 52, 54, 56, 58 and out over the individual CS0, CS1, CAS and RAS pads 72, 78, 74, 76 of the IC 20.

The present invention can also output, observe and analyze additional signals. Essentially, any input into the DRAM circuits 24, 28 can be piped to the observation device. That is, additional address, data and control signals may be piped to the observation device by the implementation of more multiplexers controlled by the test mode signals and having outputs connected to a pad. The additional address, data and control signals can also be routed through the fuse ID part to the TDQ multiplexers as well. Examples of these signals are the write enable (WE), data masking (DQM), clock enable (CE) and row and column address signals (A0–A9).

The present invention has been described with the use of embedded DRAM, but it should be appreciated that the invention can be practiced with other embedded RAM devices such as an embedded SRAM if so desired.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor integrated circuit device comprising:
   at least one memory circuit, said at least one memory circuit comprising an array of memory cells;
   at least one logic circuit associated with and coupled to a respective memory circuit, said at least one logic circuit providing a plurality of signals to its respective memory circuit for controlling access to its associated array of memory cells; and
   a test circuit coupled to receive said plurality of signals provided by said at least one logic circuit, said test circuit being responsive to at least one control signal selecting a first test mode for outputting a first portion of said plurality of signals to test terminals of said semiconductor integrated circuit device.

2. The device of claim 1 wherein said plurality of signals comprise a plurality of addressing signals used to access said array of memory cells.

3. The device of claim 2 wherein said plurality of addressing signals comprise a chip select signal.

4. The device of claim 2 wherein said plurality of addressing signals comprise a column address strobe signal.

5. The device of claim 2 wherein said plurality of addressing signals comprise a row address strobe signal.

6. The device of claim 2 wherein said plurality of addressing signals comprise a write enable signal.

7. The device of claim 2 wherein said plurality of addressing signals comprise a clock enable signal.

8. The device of claim 1 wherein said plurality of signals comprise a plurality of test data signals used to test said array of memory cells.

9. The device of claim 1 wherein each memory circuit is a DRAM circuit.

10. The device of claim 1 wherein each memory circuit further comprises a configuration circuit coupled to its associated plurality of signals and said test circuit, wherein said test circuit is responsive to at least one control signal selecting a second test mode for outputting a second portion of said plurality of signals received from a configuration circuit of an accessed memory circuit to test terminals of said semiconductor device.

11. The device of claim 1 wherein said test circuit comprises a plurality of multiplexers, each multiplexer having an input coupled to a respective signal of said plurality of signals and having an output controlled by said at least one control signal, wherein said multiplexers output their respective signals to said test terminals when said at least one control signal selects said first mode.

12. The device of claim 11 wherein one of said multiplexers outputs a chip select signal to a chip select test terminal of said semiconductor device.

13. The device of claim 11 wherein one of said multiplexers outputs a column address strobe signal to a column address strobe test terminal of said semiconductor device.

14. The device of claim 11 wherein one of said multiplexers outputs a row address strobe signal to a row address strobe test terminal of said semiconductor device.

15. The device of claim 11 wherein one of said multiplexers outputs a write enable signal to a write enable test terminal of said semiconductor device.

16. The device of claim 11 wherein one of said multiplexers outputs a clock enable signal to a clock enable test terminal of said semiconductor device.

17. The device of claim 11 wherein one of said multiplexers outputs a plurality of test data signals used to test said array of memory cells to a plurality of test data test terminals of said semiconductor device.

18. The apparatus of claim 11 wherein one of said multiplexers outputs a write enable signal to a write enable test terminal of said semiconductor device.

19. The apparatus of claim 11 wherein one of said multiplexers outputs a clock enable signal to a clock enable test terminal of said semiconductor device.

20. The device of claim 1 wherein a number of said at least one control signal is two.

21. The device of claim 1 wherein said test circuit is coupled to receive a second plurality of signals provided by each memory circuit, said test circuit being responsive to at least one control signal selecting a second test mode for outputting a first portion of said second plurality of signals to test terminals of said semiconductor device.

22. The device of claim 21 wherein said test circuit comprises a plurality of multiplexers, each multiplexer having an input coupled to a respective signal of said second plurality of signals and having an output controlled by said at least one control signal, wherein said multiplexers output their respective signals to said test terminals when said at least one control signal selects said second mode.

23. An apparatus for testing a semiconductor integrated circuit device, comprising:
an observation device; and
a semiconductor integrated circuit device coupled to said observation device, said semiconductor integrated circuit device comprising:
at least one memory circuit, said at least one memory circuit comprising an array of memory cells;
at least one logic circuit associated with and coupled to a respective memory circuit, said at least one logic circuit providing a plurality of signals to its respective memory circuit for controlling access to its associated array of memory cells; and
a test circuit coupled to said observation device and being coupled to receive said plurality of signals provided by said at least one logic circuit, said test circuit being responsive to at least one control signal selecting a first test mode for outputting a first portion of said plurality of signals to said observation device through test terminals of said semiconductor integrated circuit device.

24. The apparatus of claim 21 wherein said plurality of signals comprise a plurality of addressing signals used to access said array of memory cells.

25. The apparatus of claim 24 wherein said plurality of addressing signals comprise a chip select signal.

26. The apparatus of claim 24 wherein said plurality of addressing signals comprise a column address strobe signal.

27. The apparatus of claim 24 wherein said plurality of addressing signals comprise a row address strobe signal.

28. The apparatus of claim 24 wherein said plurality of addressing signals comprise a write enable signal.

29. The apparatus of claim 24 wherein said plurality of addressing signals comprise a clock enable signal.

30. The apparatus of claim 23 wherein said plurality of signals comprise a plurality of test data signals used to test said array of memory cells.

31. The apparatus of claim 23 wherein each memory circuit is a DRAM circuit.

32. The apparatus of claim 23 wherein each memory circuit further comprises a configuration circuit coupled to its associated plurality of signals and said test circuit, wherein said test circuit is responsive to at least one control signal selecting a second test mode for outputting a second portion of said plurality of signals received from a configuration circuit of an accessed memory circuit to said observation device through said test terminals of said semiconductor device.

33. The apparatus of claim 23 wherein said test circuit comprises a plurality of multiplexers, each multiplexer having an input coupled to a respective signal of said plurality of signals and having an output controlled by said at least one control signal, wherein said multiplexers output their respective signals to said observation device through said test terminals when said at least one control signal selects said first mode.

34. The apparatus of claim 33 wherein one of said multiplexers outputs a chip select signal to a chip select test terminal of said semiconductor device.

35. The apparatus of claim 33 wherein one of said multiplexers outputs a column address strobe signal to a column address strobe test terminal of said semiconductor device.

36. The apparatus of claim 33 wherein one of said multiplexers outputs a row address strobe signal to a row address strobe test terminal of said semiconductor device.

37. The apparatus of claim 33 wherein one of said multiplexers outputs a plurality of test data signals used to test said array of memory cells to a plurality of test data test terminals of said semiconductor device.

38. The apparatus of claim 23 wherein a number of said at least one control signal is two.

39. The apparatus of claim 23 wherein said test circuit is coupled to receive a second plurality of signals provided by each memory circuit, said test circuit being responsive to at least one control signal selecting a second test mode for outputting a first portion of said second plurality of signals to said observation device through test terminals of said semiconductor device.

40. The apparatus of claim 39 wherein said test circuit comprises a plurality of multiplexers, each multiplexer having an input coupled to a respective signal of said second plurality of signals and having an output controlled by said at least one control signal, wherein said multiplexers output their respective signals to said observation device through said test terminals when said at least one control signal selects said second mode.

41. The apparatus of claim 21 wherein said observation device configures said semiconductor device into said first mode.

42. The apparatus of claim 21 wherein said observation device is a logic analyzer.

43. The apparatus of claim 21 wherein said observation device is an oscilloscope.

44. An apparatus for testing a semiconductor device, comprising:
an observation device; and
a semiconductor device coupled to said observation device, said semiconductor device comprising:
a first memory circuit comprising an array of memory cells;
a second memory circuit comprising an array of memory cells;
a first logic circuit associated with and coupled to said first memory circuit, said first logic circuit providing a first plurality of signals to said first memory circuit for controlling access to its associated array of memory cells;
a second logic circuit associated with and coupled to said first and second memory circuits, said second logic circuit providing a second plurality of signals to said first and second memory circuits for controlling access to their associated arrays of memory cells;
a third logic circuit associated with and coupled to said second memory circuit, said third logic circuit providing a third plurality of signals to said second memory circuit for controlling access to its associated array of memory cells; and
a test circuit coupled to said observation device and being coupled to receive said first, second and third plurality of signals of said logic circuits, said test circuit being responsive to at least one control signal selecting a first test mode for outputting a portion of said plurality of signals to said observation device through test terminals of said semiconductor device.

45. A method of testing a semiconductor device comprising a logic circuit and a memory circuit, said method comprising:
providing a test circuit on the semiconductor device coupled to the logic circuit and the memory circuit;

routing first control signals provided by the logic circuit to the memory circuit into the test circuit; and placing said semiconductor device into an observation mode where the routed control signals are output by said test circuit to test terminals of the semiconductor device.

46. The method of claim 45 further comprising the step of observing the outputted control signals to the test terminals to determine if the memory circuit is being accessed correctly.

47. The method of claim 45 further comprising the steps of:

routing second control signals received by the memory circuit into the test circuit; and placing said semiconductor device into a second observation mode where the routed second control signals are output by said test circuit to test terminals of the semiconductor device.

48. The method of claim 47 further comprising the steps of:

routing the second control signals received by the memory circuit into a configuration circuit of the memory circuit; and placing said semiconductor device into a third observation mode where the configuration circuit routed second control signals are output by said configuration circuit to test terminals of the semiconductor device.

* * * * *

UNITED STATES PATENT AND TRADEMARK OFFICE
CERTIFICATE OF CORRECTION

PATENT NO.    : 6,535,999 B1
DATED         : March 18, 2003
INVENTOR(S)   : J. W. Thompson et al.

It is certified that error appears in the above-identified patent and that said Letters Patent is hereby corrected as shown below:

<u>Column 4,</u>
Line 62, "(VVE)" should read -- (WE) --.

Signed and Sealed this

Ninth Day of September, 2003

JAMES E. ROGAN
*Director of the United States Patent and Trademark Office*